United States Patent
Chiu et al.

(10) Patent No.: US 7,436,395 B2
(45) Date of Patent: Oct. 14, 2008

(54) SIMPLIFIED CAPACITIVE TOUCHPAD AND METHOD THEREOF

(75) Inventors: Yen-Chang Chiu, Linkou Shiang (TW); Yung-Lieh Chien, Taoyuan (TW); Cheng-Hao Tang, Tucheng (TW)

(73) Assignee: Elan Microelectronics Corporation, Hsinchu (TW)

( * ) Notice: Subject to any disclaimer, the term of this patent is extended or adjusted under 35 U.S.C. 154(b) by 599 days.

(21) Appl. No.: 11/052,086

(22) Filed: Feb. 8, 2005

(65) Prior Publication Data

US 2005/0179672 A1   Aug. 18, 2005

(30) Foreign Application Priority Data

Feb. 17, 2004   (TW) ............................. 93103816 A

(51) Int. Cl.
*G06F 3/044* (2006.01)
*G06F 3/041* (2006.01)
*G06F 3/033* (2006.01)

(52) U.S. Cl. .................... 345/173; 345/174; 178/18.03; 178/18.06

(58) Field of Classification Search ............. 345/173, 345/174; 178/18.01, 18.03, 18.06
See application file for complete search history.

(56) References Cited

U.S. PATENT DOCUMENTS

| | | | | | |
|---|---|---|---|---|---|
| 5,889,236 | A | * | 3/1999 | Gillespie et al. | 178/18.01 |
| 5,907,327 | A | * | 5/1999 | Ogura et al. | 715/764 |
| 5,995,083 | A | * | 11/1999 | Sato et al. | 345/173 |
| 6,028,271 | A | * | 2/2000 | Gillespie et al. | 178/18.01 |
| 6,037,929 | A | * | 3/2000 | Ogura et al. | 345/173 |
| 6,359,616 | B1 | * | 3/2002 | Ogura et al. | 345/173 |
| 6,610,936 | B2 | * | 8/2003 | Gillespie et al. | 178/18.01 |
| 6,661,410 | B2 | * | 12/2003 | Casebolt et al. | 345/173 |
| 7,088,340 | B2 | * | 8/2006 | Kato | 345/168 |
| 2005/0134577 | A1 | * | 6/2005 | Lin et al. | 345/173 |

* cited by examiner

*Primary Examiner*—My-Chau T Tran
(74) *Attorney, Agent, or Firm*—Rosenberg, Klein & Lee

(57) ABSTRACT

In a capacitive touchpad, a plurality of sensing zones are defined, and a controller is connected with a plurality of scan lines for sensing a movement of an object slipping on the plurality of sensing zones, wherein at least one of the plurality of scan lines is connected to at least two of the plurality of sensing zones. The distance, speed and direction of the movement are determined by detecting the object on the touchpad at two positions upon two scans, and thereby the control of a scroll bar is accomplished. The capacitive touchpad is applied for a Z-axis arrangement on a mouse and a scroll arrangement on a keyboard.

20 Claims, 8 Drawing Sheets

SIMPLIFIED CAPACITIVE TOUCHPAD AND METHOD THEREOF

FIELD OF THE INVENTION

The present invention is related generally to a capacitive touchpad, and more particularly, to a capacitive touchpad with reduced scan lines and a method for the touchpad.

BACKGROUND OF THE INVENTION

Capacitive touchpad is widely used for the pointing device in a computer system. A capacitive touchpad typically has a large number of scan lines connected from the controller chip of the touchpad to a group of X trances and a group of Y trances that are arranged to have a matrix of intersections each between one X trace and one Y trace, and detects the position on a panel of the touchpad that is touched by an object such as finger or conductor by detecting the capacitance change at the intersection corresponding to the touched position. The conventional capacitive touchpad could further determine the distance and speed of a movement of the object slipping on the panel upon the variations of the touched position.

To connect with scan lines, the controller chip of a conventional capacitive touchpad is requested to have a large number of pins each for one of the scan lines. In other words, the number of the pins for the scan lines is the same as the number of the scan lines. As the number of the scan lines increases, the number of the pins on a controller chip of a conventional capacitive touchpad increases accordingly, and the related circuit in the controller is also enlarged. As a result, the chip size and the cost of the fabrication as well as the package for the controller chip increase. Moreover, in the operations of a capacitive touchpad, the more the scan lines the touchpad has, the more power the controller thereof consumes.

Therefore, it is desired a simplified capacitive touchpad with lower cost and power consumption.

SUMMARY OF THE INVENTION

One object of the present invention is to provide a simplified capacitive touchpad with reduced amount of scanning work thereof.

Another object of the present invention is to provide a novel application of a capacitive touchpad that detects a movement in one or more directions, rather than the exact position of a touch on the panel of the touchpad.

A capacitive touchpad according to the present invention comprises a plurality of sensing zones, a plurality of scan lines for scanning the plurality of sensing zones, and a controller connected with the plurality of scan lines for sensing a movement of an object slipping on the plurality of sensing zones, wherein at least one of the plurality of scan lines is connected to at least two of the plurality of sensing zones. The method for sensing the movement of the object slipping on the touchpad comprises detecting the object on the touchpad at a first position during a first scan and at a second position during a second scan to determine a distance and direction of the movement. Alternatively, the controller further determines a speed of the movement from the time interval and distance between the first and second positions.

The capacitive touchpad is applied for a Z-axis arrangement on a mouse and a scroll arrangement on a keyboard.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
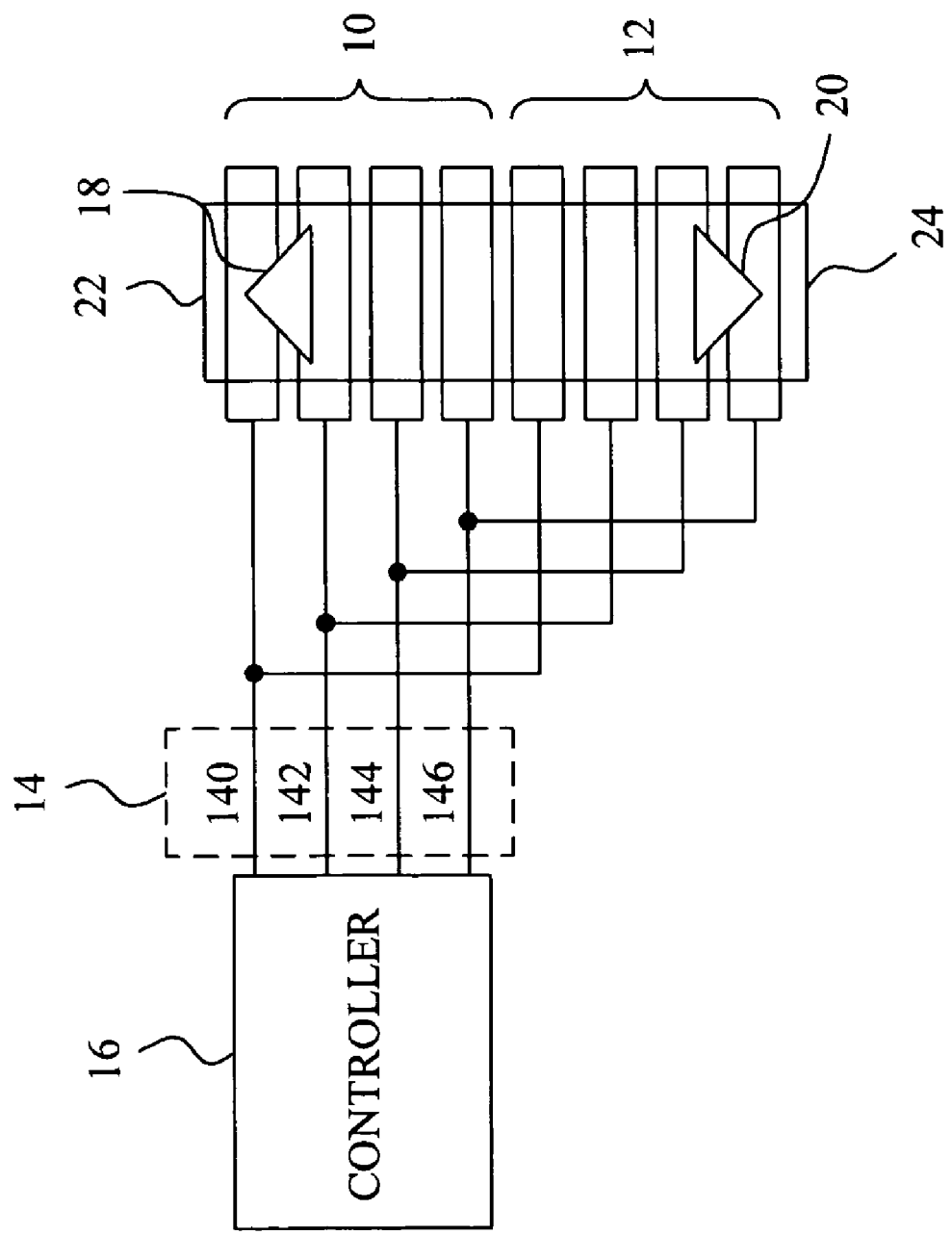
FIG. 1 shows an illustrative diagram of a capacitive touchpad according to the present invention.

FIG. 1 shows an illustrative diagram of a capacitive touchpad according to the present invention, in which it is defined two sensing zones 10 and 12 each having four traces, a group of scan lines 14 includes four scan lines 140, 142, 144 and 146 each connected to one trace of the sensing zone 10 and one trace of the sensing zone 12 for scanning the sensing zones 10 and 12, and a controller 16 is connected with the scan lines 140, 142, 144 and 146 for sensing a movement of an object such as finger or conductor slipping on the sensing zones 10 and 12. Alternatively, depending on the specific applications, a capacitive touchpad according to the present invention may have more sensing zones, and the sensing zones may have a same area or different areas, and a same number of scan lines or different numbers of scan lines. In one embodiment, a touchpad comprises at least a sensing zone whose traces are more than those of the other sensing zones, and the group of scan lines includes at least one scan line not connected to all of the sensing zones. Referring to FIG. 1, since the sensing zones 10 and 12 are connected in parallel to the controller 16 by the group of scan lines 14, the controller 16 could scan the sensing zones 10 and 12 simultaneously by the scan lines 140, 142, 144 and 146. The capacitive touchpad may be applied for a Z-axis arrangement on a mouse and a scroll arrangement on a keyboard, to determine the distance, direction and speed of the movement on the touchpad, and to thereby provide a scroll function by the distance and direction of the movement, as well as determine the scroll acceleration by the distance and speed of the movement. As shown in FIG. 1, the direction of a movement on the touchpad may be an upward direction 18 or a downward direction 20, and the top end 22 of the sensing zone 10 and the bottom end 24 of the sensing zone 12 may be in correspondence with the upper and lower edges respectively, of a scroll bar on a window. If a touchpad has more sensing zones that are connected in parallel to the controller of the touchpad by a group of scan lines, the area for the finger to slip thereon to control the scroll bar on a window will be enlarged.

Figure 2:
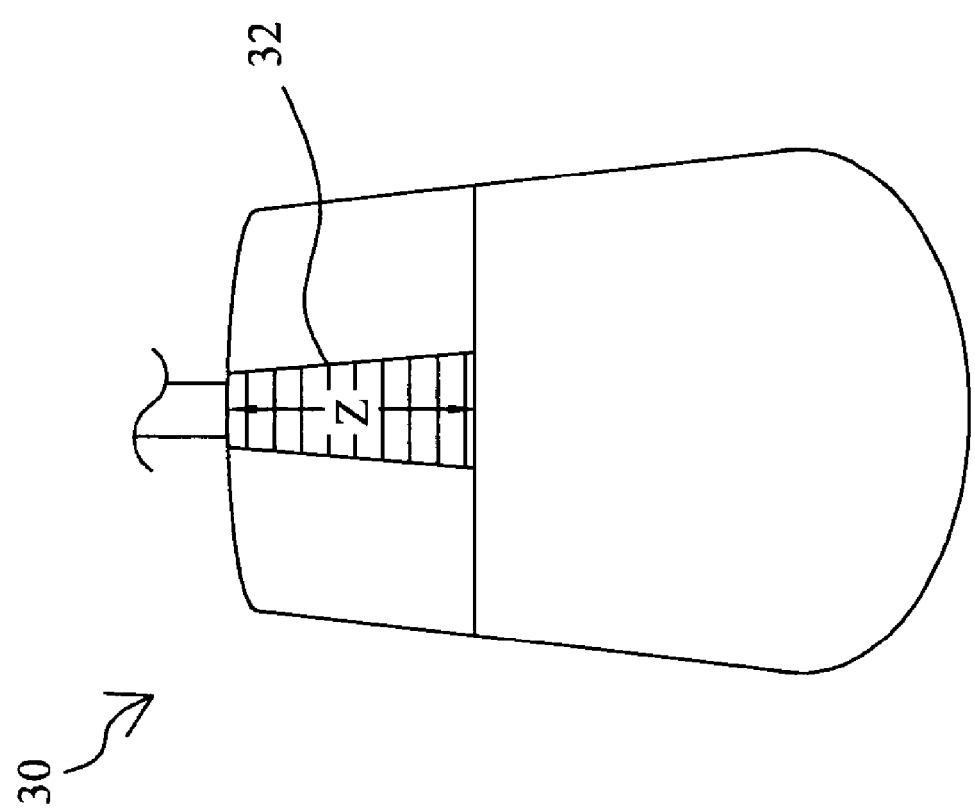
FIG. 2 shows an illustrative diagram of a mouse that has a Z-axis arrangement employing the touchpad shown in FIG. 1.
Figure 3:
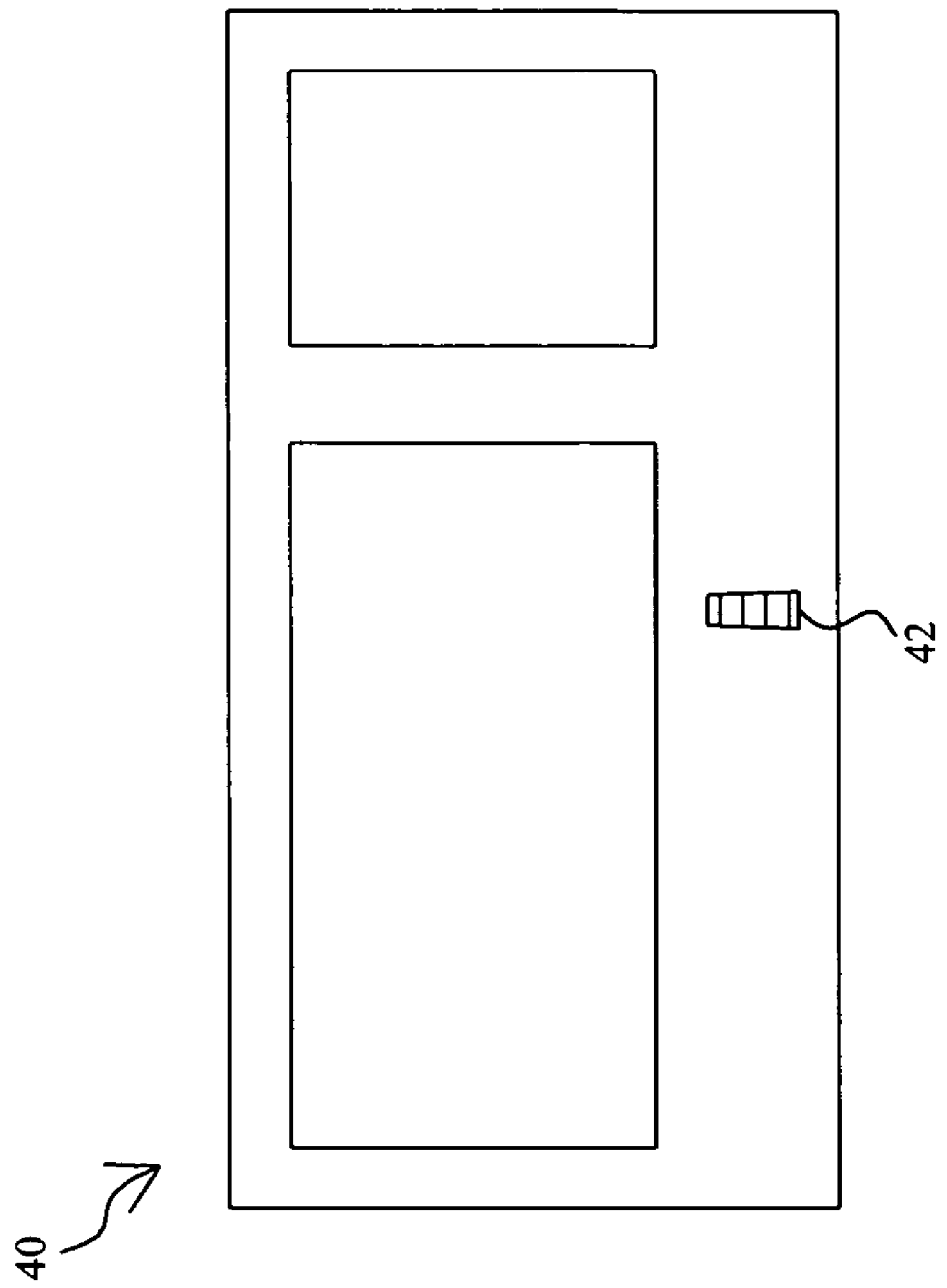
FIG. 3 shows an illustrative diagram of a keyboard that has a scroll arrangement employing the touchpad shown in FIG. 1.

Two applications of the touchpad shown in FIG. 1 are illustrated by FIG. 2 and FIG. 3. In FIG. 2, a mouse 30 has a Z-axis arrangement 32 that employs the touchpad as the interface operated by users to control the scroll bar on a window. In FIG. 3, a keyboard 40 has a scroll arrangement 42 that employs the touchpad as the interface operated by users to control the scroll bar on a window. Briefly, the touchpad on the mouse 30 or on the keyboard 40 represents a scroll bar on the window that is operated on a computer system having the mouse 30 or the keyboard 40 as its peripheral. In association with a detection method carried out by the touchpad, the distance, direction and speed of a movement of a finger slipping on the touchpad are determined by two positions of the finger and the time interval between the two positions that are detected. The scrolling direction and amount of the scroll bar on a window could be determined by the direction and distance of the movement of the finger slipping on the touchpad, and the scrolling acceleration of the scroll bar on the window could be determined by the speed of the movement.

Referring to FIG. 1, in this embodiment, there are eight traces in total arranged for a one-directional scroll bar and for two defined sensing zones 10 and 12, and therefore, only four scan lines 140, 142, 144 and 146 are required to sense the sensing zones 10 and 12 by each scan line connected to both of the sensing zones 10 and 12. To scan the sensing zones 10 and 12, it is scanned in turn by the pairs of scan lines 140 and 142, 142 and 144, 144 and 146, as well as 146 and 140, each time one pair of scan lines to sense the sensing zones 10 and 12 simultaneously. In one scan cycle, four scans are performed to completely sense the sensing zones 10 and 12 once by the four pairs of scan lines each for one scan. Subsequently, the position where a finger touches is determined during each scan cycle, and the distance, speed and direction of the movement of the finger slipping on the sensing zones 10 and 12 are determined by two detected positions of two scan cycles. Moreover, if the finger is detected at the upper end 22 of the touchpad, an automatic scroll-up function is initialized, and if the finger is detected at the lower end 24 of the touchpad, an automatic scroll-down function is initialized.

Figure 4A:
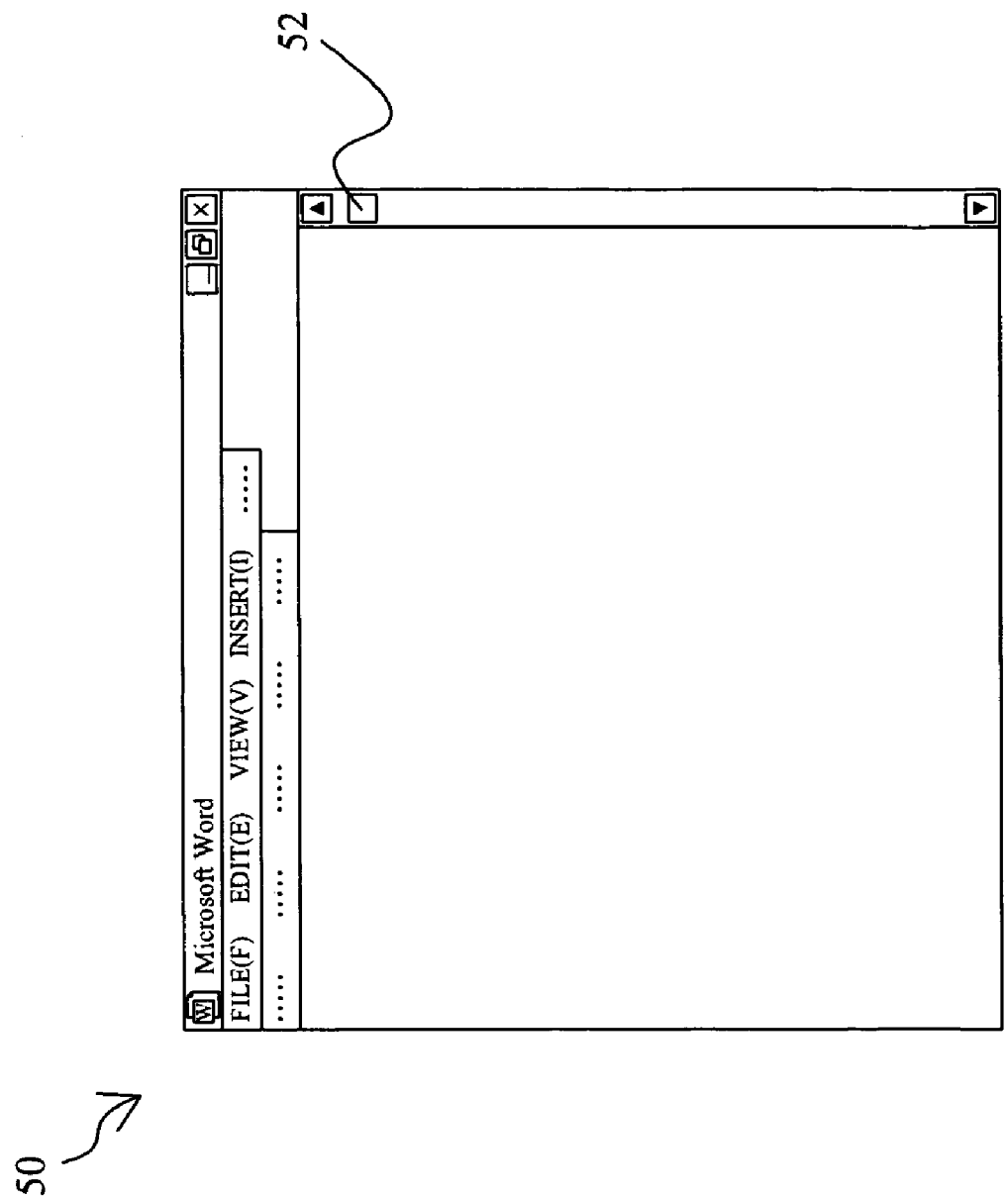
FIG. 4A shows an illustrative diagram of a window that is scrolled by the touchpad shown in FIG. 1.

FIG. 4A shows an illustrative diagram of a window that is operated by the touchpad shown in FIG. 1. In a window 50, the touchpad could directly control the scroll bar 52 on the window 50 to scroll the window 50 upward and downward, without moving the curser on the scroll bar 52 in advance. When a finger is slipping on the sensing zones 10 and 12 to scroll the window 50, several exemplary waveforms are illustrated in FIGS. 4B to 4G for various positions of the finger.

Figure 4C:
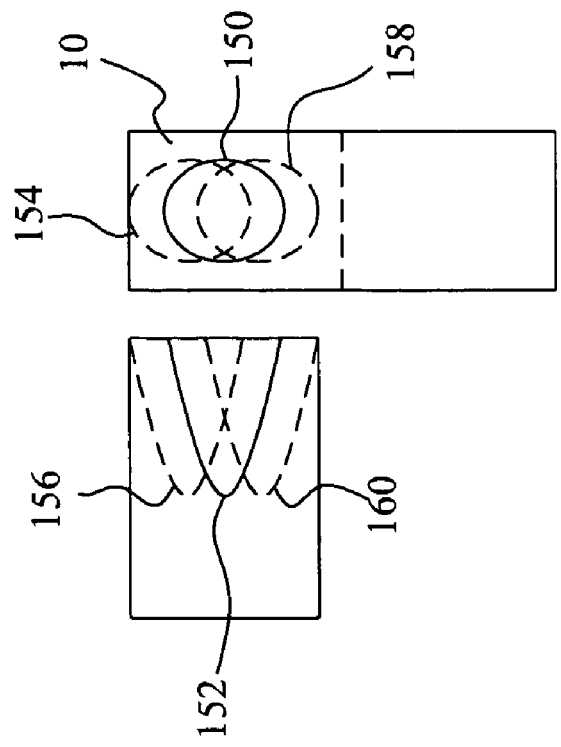
FIGS. 4B to 4G show several illustrative waveforms upon a finger slipping on the touchpad shown in FIG. 1 to scroll the window shown in FIG. 4A.
Figure 4B:
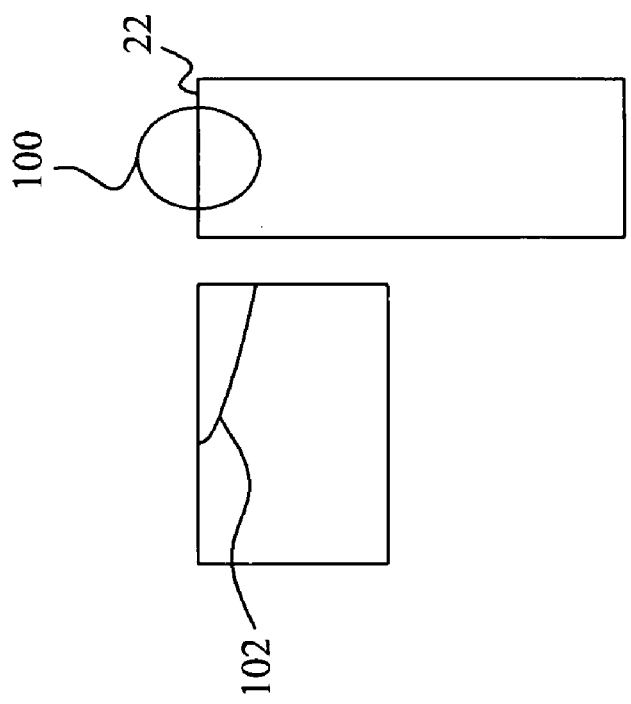

In FIG. 4B, the finger touches at the upper end 22 of the touchpad, and a waveform 102 is produced accordingly. The position 100 of the finger is thus determined by the controller 16 upon the waveform 102, and the automatic scroll-up function could be further initialized by the controller 16.

When the finger is slipping on the sensing zone 10, FIG. 4C shows the detected waveforms. The position 150 produces the waveform 152, and when the finger moves to the position 154, waveform 156 is produced. If the finger moves downward from the position 150 to position 158, waveform 160 is produced. Based on the waveforms 152 and 156, or 152 and 160, obtained from two scan cycles, the controller 16 may determine the distance and direction of the movement of the finger, and further control the scroll bar 52. In particular, if the waveforms 152 and 156 are detected from two scan cycles, the finger is determined to slip upward, and the automatic scroll-up function is initialized. On the contrary, if the waveforms 152 and 160 are detected from two scan cycles, the finger is determined to slip downward, and the automatic scroll-down function is initialized. From the distance and time interval between the two detected positions, the speed of the movement may be further obtained, and the controller 16 could further determine the scroll acceleration of the scroll bar.

Figure 4D:
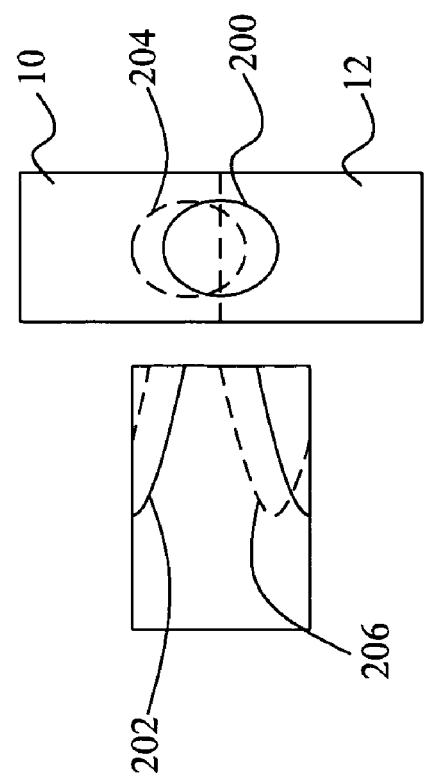
Figure 4E:
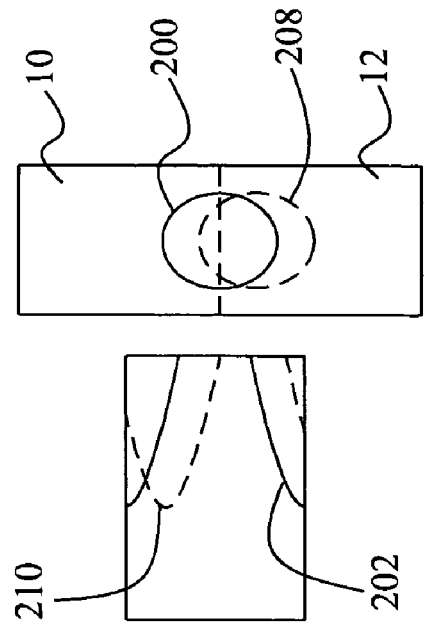

FIGS. 4D and 4E show the waveforms when the finger is slipping across the boundary between the sensing zones 10 and 12. As shown in FIG. 4D, the position 200 produces the waveform 202, and when the finger moves upward to the position 204, waveform 206 is produced. Based on the waveforms 202 and 206 obtained from two scan cycles, the controller 16 may determine the finger moves upward from the position 200 to the position 204 and the distance of the movement, and further initialize the automatic scroll-up function. In FIG. 4E, two positions 200 and 208 are determined by two detected waveforms 202 and 210 from two scan cycles, and accordingly, the controller 16 may determine the finger moves downward from the position 200 to the position 208 and the distance of the movement, and further initialize the automatic scroll-down function.

Figure 4G:
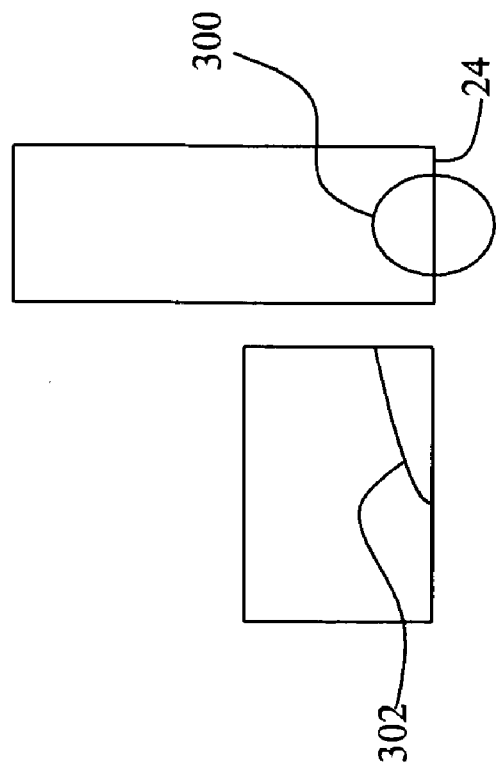
Figure 4F:
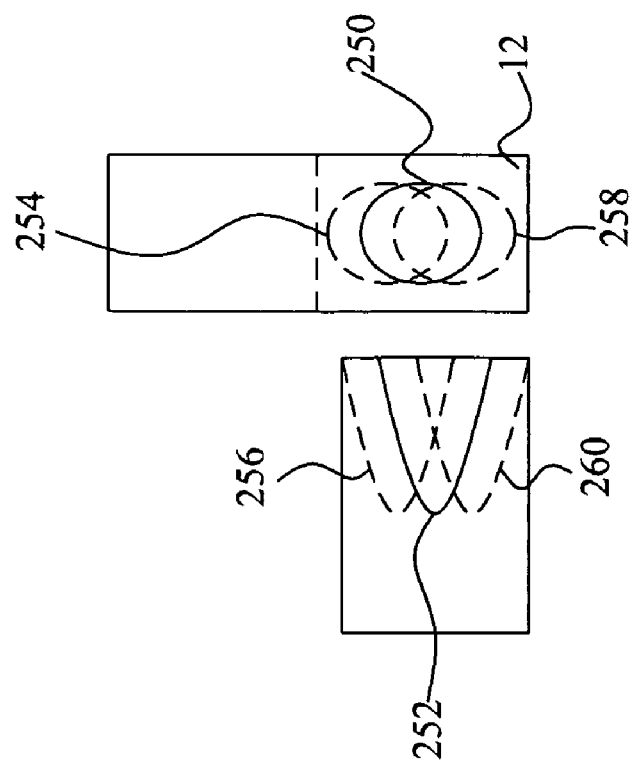

FIG. 4F shows the detected waveforms when the finger is slipping on the sensing zone 12. The position 250 produces the waveform 252. If the finger moves upward to the position 254, waveform 256 is produced. Alternatively, when the finger moves downward to the position 258, waveform 260 is produced. Based on the waveforms 252 and 256, or 252 and 260, obtained from two scan cycles, the controller 16 may determine the distance and direction of the movement of the finger, and further control the scroll bar 52. If the waveforms 252 and 256 are detected from two scan cycles, the finger is determined to slip upward, and the automatic scroll-up function is initialized, while if the waveforms 252 and 260 are detected from two scan cycles, the finger is determined to slip downward, and the automatic scroll-down function is initialized. From the distance and time interval between the two detected positions, the speed of the movement may be further obtained, and the controller 16 could further determine the scroll acceleration of the scroll bar.

In FIG. 4G, the position 300 the finger touches is at the lower end 24 of the touchpad, and it produces the waveform 302. The controller 16 may determine the finger at the lower end 24 of the touchpad upon the waveform 302, and initializes the automatic scroll-down function.

Figure 5:
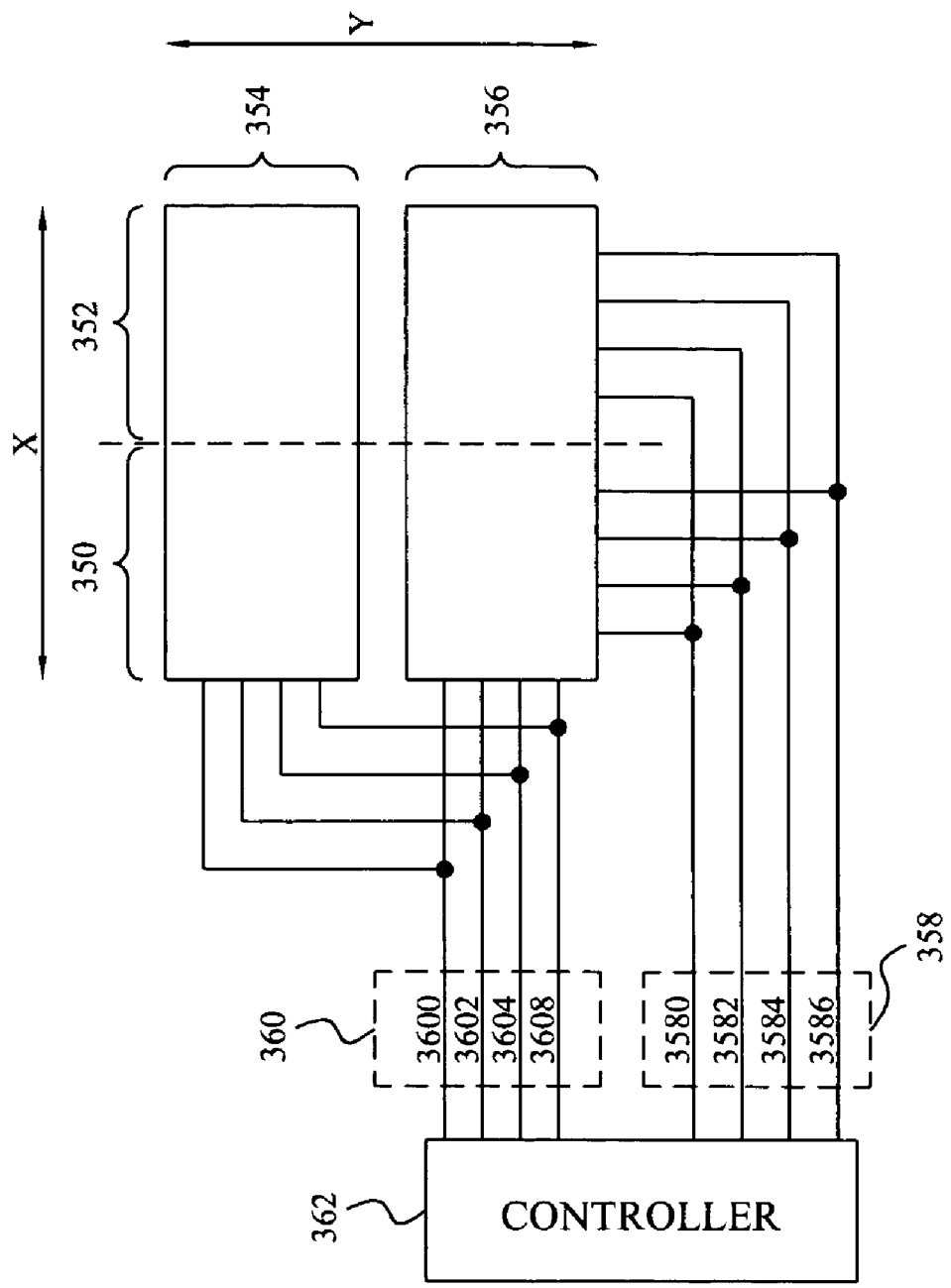
FIG. 5 shows an illustrative diagram of another capacitive touchpad according to the present invention.

FIG. 5 shows an illustrative diagram of another capacitive touchpad according to the present invention. The touchpad of this embodiment allows the detection of a movement in X and Y directions. Sensing zones 350 and 352 are defined for the X-direction, and sensing zones 354 and 356 are defined for the Y-direction. In the group of scan lines 358 for the detection of a movement in the X direction, each of scan lines 3580, 3582, 3584 and 3586 is connected to both of the sensing zones 350 and 352. Likewise, in the group of scan lines 360 for the detection of a movement in the Y direction, each of scan lines 3600, 3602, 3604 and 3608 is connected to both of the sensing zones 354 and 356. There are sixteen traces, i.e., eight X traces and eight Y traces, in this embodiment, but only eight scan lines are provided. In other words, the number of the scan lines is one half of that of the traces. In other embodiments, depending on the specific applications, a capacitive touchpad may have more sensing zones in either one or both of the X and Y directions, and the sensing zones may have a same area or different areas. Furthermore, the numbers of the scan lines for the X and Y directions may be same or different, and the sensing zones may have a same area or different areas. In yet other embodiments, there is at least one scan line not connected to all the sensing zones in the X direction or in the Y direction. A controller 362 is connected with the groups of scan lines 358 and 360, to detect the sensing zones 350 and 352 simultaneously by the scan lines 3580, 3582, 3584 and 3586, and to detect the sensing zones 354 and 356 simultaneously by the scan lines 3600, 3602, 3604 and 3608. When this touchpad is applied for a Z-axis arrangement on a mouse or a scroll arrangement on a keyboard, it is capable of providing the direct control of a vertical scroll bar and a horizontal scroll bar, by determining the distance, speed and direction of a movement of an object slipping on the touchpad in both the X and Y directions.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A simplified capacitive touchpad comprising:
   a plurality of sensing zones containing a plurality of traces, each of said traces in one sensing zone being arranged in parallel to a corresponding trace in another sensing zone;
   a plurality of scan lines for scanning the plurality of sensing zones; and a controller connected with the plurality of scan lines for sensing a movement of an object slipping on the plurality of sensing zones;
   wherein at least one of the plurality of scan lines is connected to at least two of the plurality of sensing zones, such that said plurality of scan lines are electrically connected in parallel to at least a pair of traces in separate sensing zones.

2. The touchpad of claim 1, wherein the plurality of sensing zones have a substantially same area.

3. The touchpad of claim 1, wherein the plurality of sensing zones have a same number of traces.

4. The touchpad of claim 1, wherein at least two of the sensing zones have different numbers of traces.

5. A method for sensing a movement of an object slipping on a capacitive touchpad, the method comprising the steps of:
   defining a plurality of sensing zones on the touchpad, containing a plurality of traces, each of said traces in one sensing zone being arranged in parallel to a corresponding trace in another sensing zone;
   connecting a plurality of scan lines to the touchpad with at least one of the plurality of scan lines connected to at least two of the plurality of sensing zones, such that said plurality of scan lines are electrically connected in parallel to at least a pair of traces in separate sensing zones;
   scanning the plurality of sensing zones by the plurality of scan lines for detecting the object on the touchpad at a first position upon a first scan and at a second position upon a second scan; and
   determining a distance and a direction of the movement from the first and second positions.

6. The method of claim 5, further comprising initializing an automatic scroll function upon the first or second position at a top end or a bottom end of the touchpad.

7. The method of claim 5, further comprising determining a speed of the movement from a time interval and the distance between the first and second positions.

8. The method of claim 5, further comprising performing a scroll bar control upon the distance and direction of the movement.

9. A capacitive touchpad for a Z-axis arrangement on a mouse, the touchpad comprising:
   a plurality of sensing zones containing a plurality of traces, each of said traces in one sensing zone being arranged in parallel to a corresponding trace in another sensing zone;
   a plurality of scan lines for scanning the plurality of sensing zones; and
   a controller connected with the plurality of scan lines for sensing a movement of an object slipping on the plurality of sensing zones, and performing a scroll function including scrolling on a window upon a distance and direction of the movement or determining a scroll acceleration on the window upon a speed of the movement;
   wherein at least one of the plurality of scan lines is connected to at least two of the plurality of sensing zones, such that said plurality of scan lines are electrically connected in parallel to at least a pair of traces in separate sensing zones.

10. The touchpad of claim 9, wherein the plurality of sensing zones have a substantially same area.

11. The touchpad of claim 9, wherein the plurality of sensing zones have a same number of traces.

12. The touchpad of claim 9, wherein at least two of the sensing zones have different numbers of traces.

13. A capacitive touchpad for a scroll arrangement on a keyboard, the touchpad comprising:
   a plurality of sensing zones containing a plurality of traces, each of said traces in one sensing zone being arranged in parallel to a corresponding trace in another sensing zone;
   a plurality of scan lines for scanning the plurality of sensing zones; and
   a controller connected with the plurality of scan lines for sensing a movement of an object slipping on the plurality of sensing zones, and performing a scroll function including scrolling on a window upon a distance and direction of the movement or determining a scroll acceleration on the window upon a speed of the movement;
   wherein at least one of the plurality of scan lines is connected to at least two of the plurality of sensing zones, such that said plurality of scan lines are electrically connected in parallel to at least a pair of traces in separate sensing zones.

14. The touchpad of claim 13, wherein the plurality of sensing zones have a substantially same area.

15. The touchpad of claim 13, wherein the plurality of sensing zones have a same number of traces.

16. The touchpad of claim 13, wherein at least two of the sensing zones have different numbers of traces.

17. A simplified capacitive touchpad comprising:
   a plurality of sensing zones in a first and second directions, each containing a plurality of traces, each of said traces in a first direction of one sensing zone being arranged in parallel to a corresponding trace in a first direction of another sensing zone, and each of said traces in a second direction of one sensing zone being arranged in parallel to a corresponding trace in a second direction of another sensing zone;
   a first group of scan lines for scanning the plurality of sensing zones in the first direction;
   a second group of scan lines for scanning the plurality of sensing zones in the second direction; and
   a controller connected with the first and second groups of scan lines for sensing a movement of an object slipping on the plurality of sensing zones in the first and second directions;
   wherein at least one of each of the first and second groups of scan lines is connected to at least two of the plurality of sensing zones in said first and second directions respectively, such that said first and second groups of scan lines are electrically connected in parallel to at least a pair of traces in separate sensing zones in each of the first and second directions respectively.

18. The touchpad of claim 17, wherein the plurality of sensing zones have a substantially same area.

19. The touchpad of claim 17, wherein the plurality of sensing zones have a same number of traces.

20. The touchpad of claim 17, wherein at least two of the sensing zones in the first or second directions have different numbers of traces.

* * * * *